(12) United States Patent
Khaw et al.

(10) Patent No.: US 7,678,613 B2
(45) Date of Patent: Mar. 16, 2010

(54) INTEGRATED CIRCUIT EDGE PROTECTION METHOD AND APPARATUS

(75) Inventors: Lee Peng Khaw, Chandler, AZ (US); Kam Meng Chong, Penang (MY); Diego Diaz, Chandler, AZ (US); Zhiyong Wang, Chandler, AZ (US); Zezhong Fu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/062,400

(22) Filed: Apr. 3, 2008

(65) Prior Publication Data

US 2008/0188038 A1 Aug. 7, 2008

Related U.S. Application Data

(62) Division of application No. 11/096,427, filed on Mar. 31, 2005, now Pat. No. 7,372,134.

(51) Int. Cl.
*H01L 21/58* (2006.01)
*H01L 21/56* (2006.01)
*H01L 23/13* (2006.01)
*H01L 23/31* (2006.01)
*H01L 23/32* (2006.01)

(52) U.S. Cl. .................. 438/118; 438/108; 438/121; 438/125; 438/126; 438/127; 257/678; 257/687; 257/701; 257/711; 257/731; 257/778

(58) Field of Classification Search ............ 257/684, 257/687, 731, 732; 438/108, 118, 125, 126, 438/127

See application file for complete search history.

(56) References Cited

U.S. PATENT DOCUMENTS

| 5,585,671 | A | | 12/1996 | Nagesh et al. | |
|---|---|---|---|---|---|
| 5,633,122 | A | * | 5/1997 | Tuttle | 430/317 |
| 6,703,299 | B2 | | 3/2004 | Shi et al. | |
| 6,834,133 | B1 | * | 12/2004 | Towle et al. | 385/14 |
| 6,982,380 | B2 | * | 1/2006 | Hoffmann et al. | 174/520 |
| 7,148,560 | B2 | * | 12/2006 | Lee et al. | 257/667 |
| 7,372,120 | B1 | * | 5/2008 | Towle et al. | 257/432 |
| 2004/0004292 | A1 | | 1/2004 | Hsieh et al. | |
| 2004/0080055 | A1 | * | 4/2004 | Jiang | 257/783 |
| 2005/0040524 | A1 | * | 2/2005 | Pu et al. | 257/734 |
| 2005/0275074 | A1 | * | 12/2005 | Weng et al. | 257/678 |

* cited by examiner

*Primary Examiner*—N Drew Richards
*Assistant Examiner*—Michael Jung
(74) *Attorney, Agent, or Firm*—Schwabe, Williamson & Wyatt, P.C.

(57) ABSTRACT

An apparatus, method, and system for providing a mechanical divider adapted to shield at least a portion of an active surface of an integrated circuit from out-gassing from underfill material. The mechanical divider is attached to a mounting substrate. The underfill material is dispensed on the mounting substrate. The integrated circuit is placed on both the mechanical divider and on the underfill material after the mechanical divider has been at least partially cured. The mechanical divider may include a base surface adapted to contact the mounting substrate, a lower wall surface extending upwardly from the base surface, an upper wall surface adapted to abut a side wall of the integrated circuit, and a ledge surface extending between the lower wall surface and the upper wall surface, the ledge surface adapted to contact at least a portion of the active surface of the integrated circuit.

16 Claims, 6 Drawing Sheets

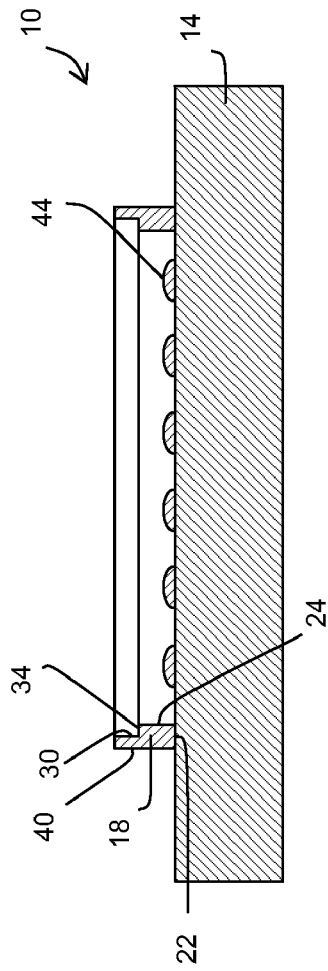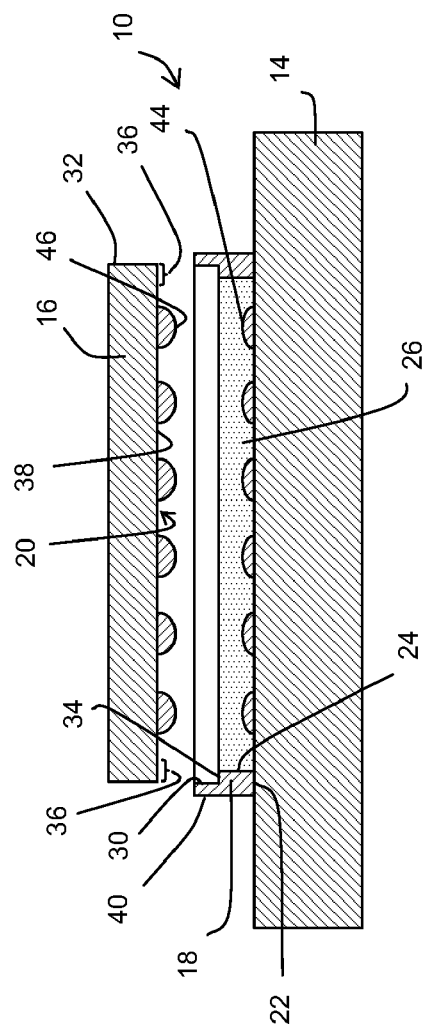

INTEGRATED CIRCUIT EDGE PROTECTION METHOD AND APPARATUS

CROSS-REFERENCES TO RELATED APPLICATIONS

This present application is a divisional of U.S. patent application Ser. No. 11/096,427 filed Mar. 31, 2005, and entitled "Integrated Circuit Edge Protection Method and Apparatus". The specification of said patent is hereby incorporated in its entirety, except for those sections, if any, that are inconsistent with this specification.

FIELD OF THE INVENTION

Disclosed embodiments of the present invention relate to the field of integrated circuits, and more particularly to integrated circuit packaging.

BACKGROUND OF THE INVENTION

With the advancement of integrated circuit technology, the need to miniaturize integrated circuit packaging to meet the needs of this integrated circuit technology has increased exponentially. This requirement has resulted in chip-scale packaging, wherein the ultimate goal is to have both the integrated circuit and the integrated circuit package be virtually the same size.

An integrated circuit package usually includes a mounting substrate and an integrated circuit, such as a semiconductor chip or die. The integrated circuit is located on or in the mounting substrate. One class of chip packaging includes integrated circuits that are produced with solder contacts, on an active surface thereof, for purposes of electrically connecting the integrated circuit to solder deposits on the mounting substrate. The term active surface of an integrated circuit, as used herein, means the surface which carries integrated circuitry. The term back surface, as used herein, means a side of the integrated circuit that is positioned opposite and parallel planar with the active surface.

During packaging, an epoxy underfill material is introduced into a space between the integrated circuit and the mounting substrate and is cured thereafter. The epoxy acts to bond the integrated circuit to the mounting substrate and to protect the solder contacts. The underfill material that has been inserted between the integrated circuit and the mounting substrate typically has a non-uniform profile. The non-uniform profile is often due to the underfill material including both an interstitial portion that is sandwiched between the integrated circuit and the mounting substrate, as well as a fillet portion that extends diagonally from the integrated circuit side walls to the mounting substrate.

BRIEF DESCRIPTION OF THE DRAWINGS

Embodiments of the invention are illustrated by way of example and not by way of limitation in the figures of the accompanying drawings, in which the like references indicate similar elements and in which:

FIGS. 3, 4, 5, 6, and 6A are cross sectional views taken along line 2-2 in FIG. 1 illustrating the example electronic assembly of FIG. 2 at various stages of construction, in accordance with an embodiment of the present invention;

DETAILED DESCRIPTION OF EMBODIMENTS OF THE INVENTION

An apparatus, method, and system for providing a mechanical divider adapted to shield at least a portion of an active surface of an integrated circuit from out-gassing from underfill material in an electronic assembly is disclosed herein. In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the embodiments of the present invention. It should also be noted that directions and references (e.g., up, down, top, bottom, etc.) may be used to facilitate the discussion of the drawings and are not intended to restrict the application of the embodiments of this invention. Therefore, the following detailed description is not to be taken in a limiting sense and the scope of the embodiments of the present invention is defined by the appended claims and their equivalents.

Figure 1:
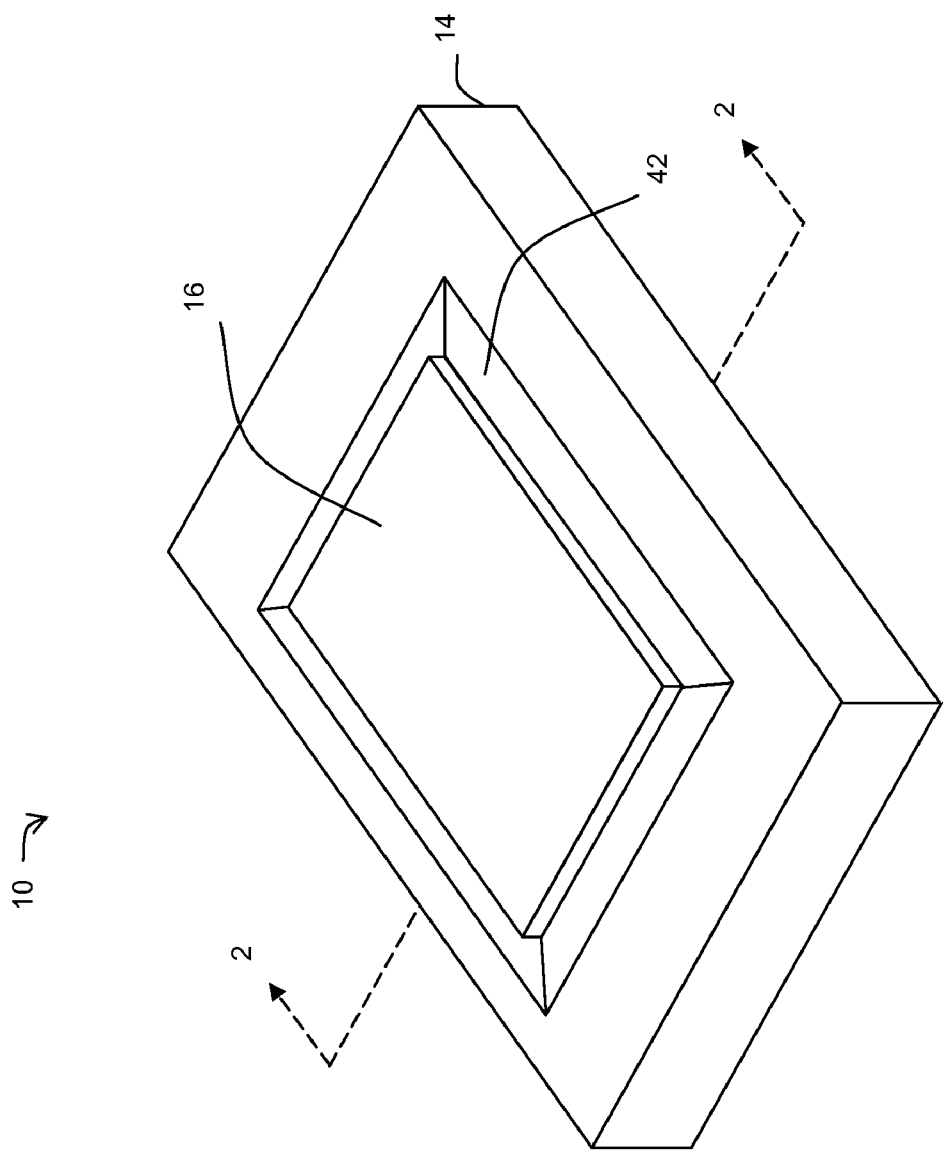
FIG. 1 is a perspective view illustrating an electronic assembly, in accordance with some embodiments of the present invention.

FIG. 1 illustrates a portion of an electronic assembly 10, in accordance with one embodiment. The electronic assembly 10 may be a semiconductor package. The semiconductor package 10 may include an integrated circuit 16 secured to a mounting substrate 14. The integrated circuit 16 may be formed in a rectangular piece of semiconductor material called a chip or a die. Examples of the semiconductor material include, but are not limited to, silicon, silicon on sapphire, and gallium arsenide. In some embodiments of the present invention, the integrated circuit 16 may be a processor. For example, the integrated circuit 16 may be a microprocessor.

Figure 2:
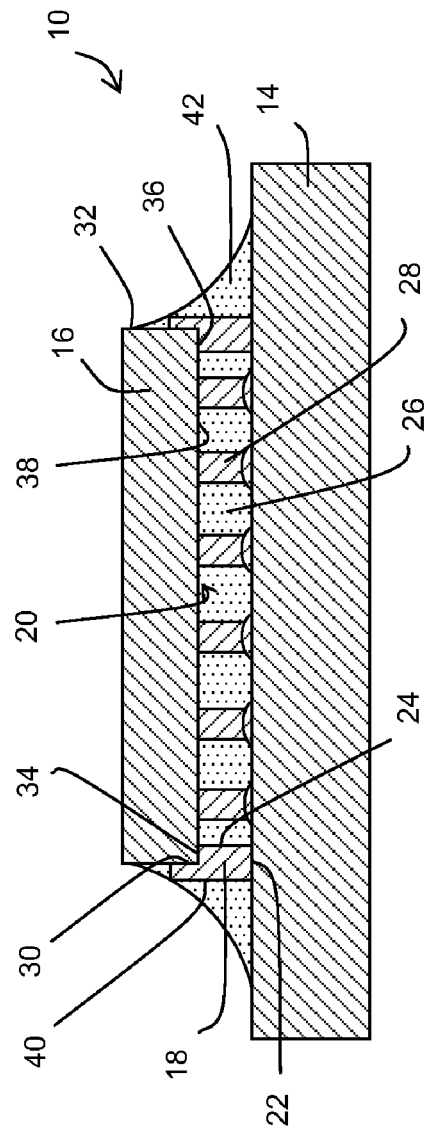
FIG. 2 is a cross sectional view taken along line 2-2 in FIG. 1 illustrating an example electronic assembly, in accordance with an embodiment of the present invention.
Figure 3:
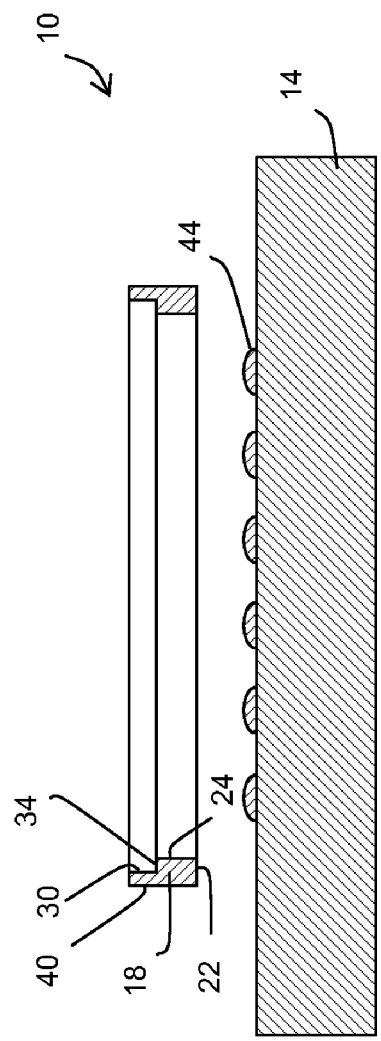

FIG. 2 illustrates an example electronic assembly 10, in accordance with an embodiment of the present invention. In some embodiments of the present invention, a mechanical divider 18 may be located between integrated circuit 16 and substrate 14. The mechanical divider 18 may contact both the integrated circuit 16 and substrate 14. The mechanical divider 18 may be adapted to shield at least a portion of an active surface 20 of the integrated circuit 16 from out-gassing from underfill material. The mechanical divider 18 may be formed of any suitable material, according to the requirements of the particular application. Examples of materials suitable for forming the mechanical divider 18 include, but are not limited to underfill materials such as epoxy and the like.

The mechanical insert 18 may include a base surface 22 adapted to contact the mounting substrate 14. A lower wall surface 24 may extend upwardly from the base surface 22. The lower wall surface 24 may be positioned to surround a first layer of underfill material 26 as well as a solder joint 28 connecting the integrated circuit 16 to the mounting substrate 14. The first layer of underfill material 26 may be formed of any suitable material, according to the requirements of the particular application. Examples of materials suitable for forming the first layer of underfill material 26 include, but are not limited to epoxy and the like. Additionally or alternatively, the underfill material 26 may be formed as no flow underfill. Further, the mechanical divider 18 may be formed of the same or different material from the first layer of underfill material 26.

An upper wall surface 30 may be located above the lower wall surface 24. The upper wall surface 30 may be horizontally displaced relative to the lower wall surface 24 so as to lie in a plane separate from a plane of the lower wall surface 24. The upper wall surface 30 may be adapted to abut a side wall 32 of the integrated circuit 16. The upper wall surface 30 may be adapted to minimize movement of the side wall 32 of the integrated circuit 16 with respect to the mounting substrate 14. Additionally or alternatively, the upper wall surface 30 may be adapted to align the side wall 32 of the integrated circuit 16 with respect to the mounting substrate 14.

A ledge surface 34 may extend between the lower wall surface 24 and the upper wall surface 30. The ledge surface 34 may be adapted to contact at least a portion of the active surface 20 of the integrated circuit 16. The ledge surface 34 may be adapted to fix the distance between the active surface 20 of the integrated circuit 16 and the mounting substrate 14. Further, the ledge surface 34 may be adapted to minimize movement of active surface 20 of the integrated circuit 16 with respect to the mounting substrate 14.

Additionally or alternatively, the ledge surface 34 may be adapted to shield at least a portion of the active surface 20 of the integrated circuit 16 from out-gassing from the first layer of underfill material 26. For example, the ledge surface 34 may contact and shield an edge portion 36 of the active surface 20 of the integrated circuit 16 from the first layer of underfill material 26, while leaving an inner portion 38 of the active surface 20 of the integrated circuit 16 open to the first layer of underfill material 26. The chemical reaction during polymerization of the first layer of underfill material 26 may result in out-gassing. This out-gassing may facilitate the formation of voids within the first layer of underfill material 26. In addition, these voids may be transported to an outer portion of the first layer of underfill material 26 near the edge portion 36 of the active surface 20 of the integrated circuit 16 as pressure build-up occurs at the inner portion 38 of the active surface 20 of the integrated circuit 16. The ledge surface 34 may shield the edge portion 36 of the active surface 20 of the integrated circuit 16 from the voids in the first layer of underfill material 26. Additionally or alternatively, the transportation of the voids from the first layer of underfill material 26 may be limited by locating the lower wall surface 24 adjacent the inner portion 38 of the active surface 20 of the integrated circuit 16.

An outer wall surface 40 of the mechanical insert 18 may be positioned opposite the lower wall surface 24. The outer wall surface 40 may extend upwardly from the base surface 22. The outer wall surface 40 may be positioned to be surrounded by a second layer of underfill material 42 connecting the integrated circuit 16 to the mounting substrate 14. Accordingly, the mechanical insert 18 may be positioned between the first layer of underfill material 26 and the second layer of underfill material 42. The second layer of underfill material 42 may be formed of any suitable material, according to the requirements of the particular application. Examples of materials suitable for forming the second layer of underfill material 42 include, but are not limited to epoxy and the like. Additionally or alternatively, the underfill material 42 may be formed as no flow underfill. Further, the second layer of underfill material 42 may be formed of the same or different material from the first layer of underfill material 26.

FIGS. 3, 4, 5, 6, and 6A illustrate an example electronic assembly 10 at given stages of construction, in accordance with an embodiment of the present invention. A solder contact 44 may be formed on an upper surface of the mounting substrate 14 to face the integrated circuit 16. Similarly, solder deposit 46 may be formed on the bottom surface of the integrated circuit 16 to face the mounting substrate 14. The solder contact 44 and/or the solder deposit 46 may be formed as a solder ball or other suitable shape, according to the requirements of the particular application. For example, the solder deposit 46 may be formed as a dimple-less bump having a concave shape. The lower wall surface 24 of the mechanical divider 18 may be adapted to form an opening to receive the solder deposit 46 on the integrated circuit 16 as well as to receive the solder contact 44 of the mounting substrate 14.

Figure 7:
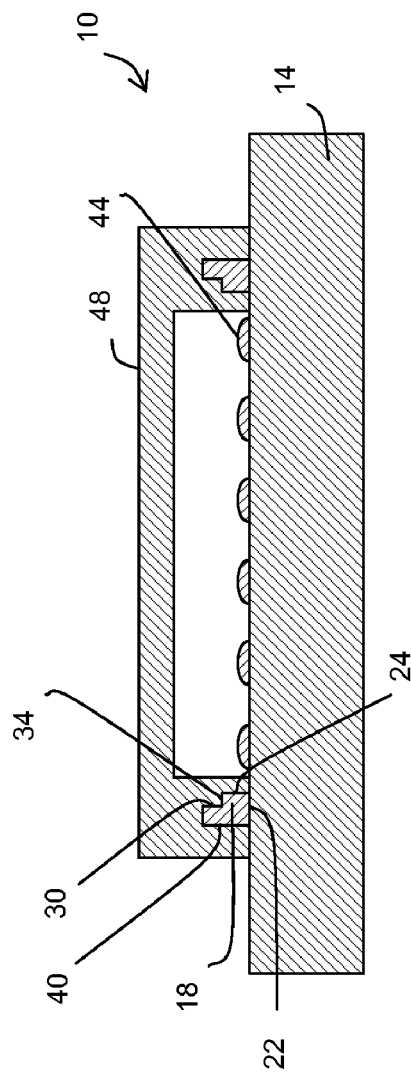
FIG. 7 is a cross sectional view taken along line 2-2 in FIG. 1 illustrating an attachment of a mechanical divider in the example electronic assembly of FIG. 2, in accordance with an embodiment of the present invention.
Figure 8:
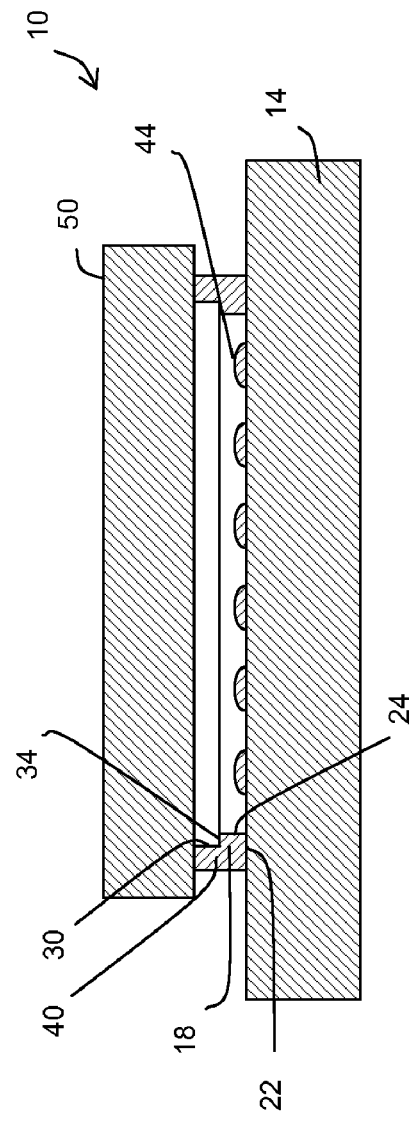
FIG. 8 is a cross sectional view taken along line 2-2 in FIG. 1 illustrating an attachment of a mechanical divider in the example electronic assembly of FIG. 2, in accordance with an embodiment of the present invention.

FIG. 4 illustrates an example electronic assembly 10 at a given stage of construction, in accordance with an embodiment of the present invention. The mechanical insert 18 may be attached to the mounting substrate 14 by any suitable method. For example, FIG. 7 illustrates an example electronic assembly 10 at a given stage of construction, in accordance with an embodiment of the present invention, where a mold 48 dispenses and at least partially cures the mechanical insert 18 to the mounting substrate 14. After the mechanical insert 18 is dispensed and at least partially cured, the mold 48 may be removed. Alternatively, FIG. 8 illustrates an example electronic assembly 10 at a given stage of construction, in accordance with an embodiment of the present invention, where a placement tool 50 places a pre-formed and at least partially cured mechanical insert 18 on the mounting substrate 14. After the mechanical insert 18 is placed on the mounting substrate, the placement tool 50 may be removed. According to the requirements of the particular application, the mechanical divider 18 may be at least partially cured prior to the placing of the integrated circuit 16 on the first layer of underfill material 26; the mechanical divider 18 may be at least partially cured while attached to the mounting substrate 14; and/or the mechanical divider 18 may be at least partially cured prior to attaching to the mounting substrate 14.

FIG. 5 illustrates an example electronic assembly 10 at a given stage of construction, in accordance with an embodiment of the present invention. The first layer of underfill material 26 may be dispensed onto the mounting substrate 14. The first layer of underfill material 26 may be dispensed within the lower wall surface 24 of the mechanical divider 18 and below the ledge surface 34 of the mechanical divider 18.

Figure 6:
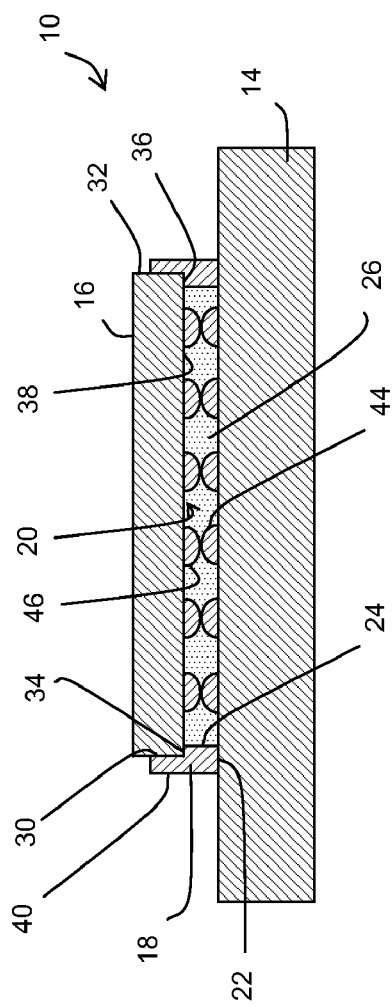

FIG. 6 illustrates an example electronic assembly 10 at a given stage of construction, in accordance with an embodiment of the present invention. At least a portion of the active surface 20 of the integrated circuit 16 may be placed on the first layer of underfill material 26. For example, the inner portion 38 of the active surface 20 of the integrated circuit 16 may be placed on the first layer of underfill material 26. At least a portion of the active surface 20 of the integrated circuit 16 may be placed on the ledge surface 34 of the mechanical divider 18. For example, the edge portion 36 of the active surface 20 of the integrated circuit 16 may be placed on the first layer of underfill material 26.

Figure 6A:
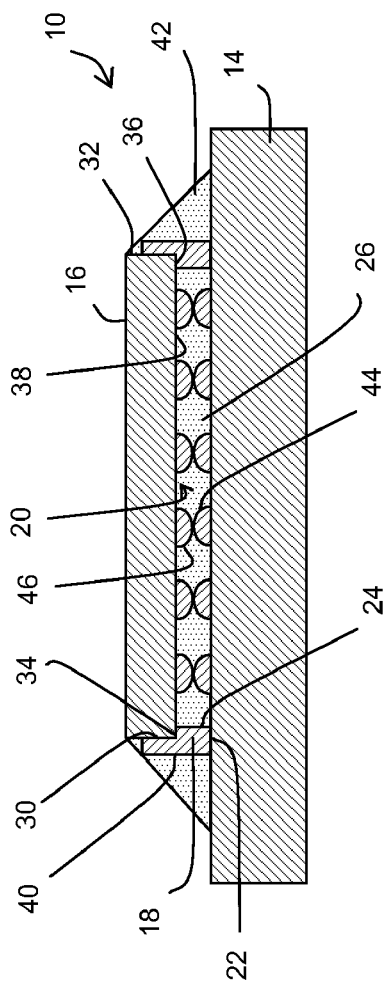

FIG. 6A illustrates an example electronic assembly 10 at a given stage of construction, in accordance with an embodiment of the present invention. Once integrated circuit 16 is placed on the mechanical insert 18 and the mounting substrate 14, the second layer of underfill material 42 may be dispensed on the mounting substrate 14. The second layer of underfill material 42 may contact one or both of the mechanical divider 18 and a non-active surface of the integrated circuit 16, such as the side wall 32.

With reference back to FIG. 2, Once the second layer of underfill material 42 is dispensed on the mounting substrate 14, reflow of the solder deposit 46 (FIG. 6A) and the solder contact 44 (FIG. 6A) may be performed. The reflow of the solder deposit 46 (FIG. 5) and the solder contact 44 (FIG. 6A) creates the solder joint 28 connecting the integrated circuit 16 to the mounting substrate 14. For example, thermal compression bonding may be used to reflow of the solder deposit 46 (FIG. 6A) and the solder contact 44 (FIG. 6A).

Figure 9:
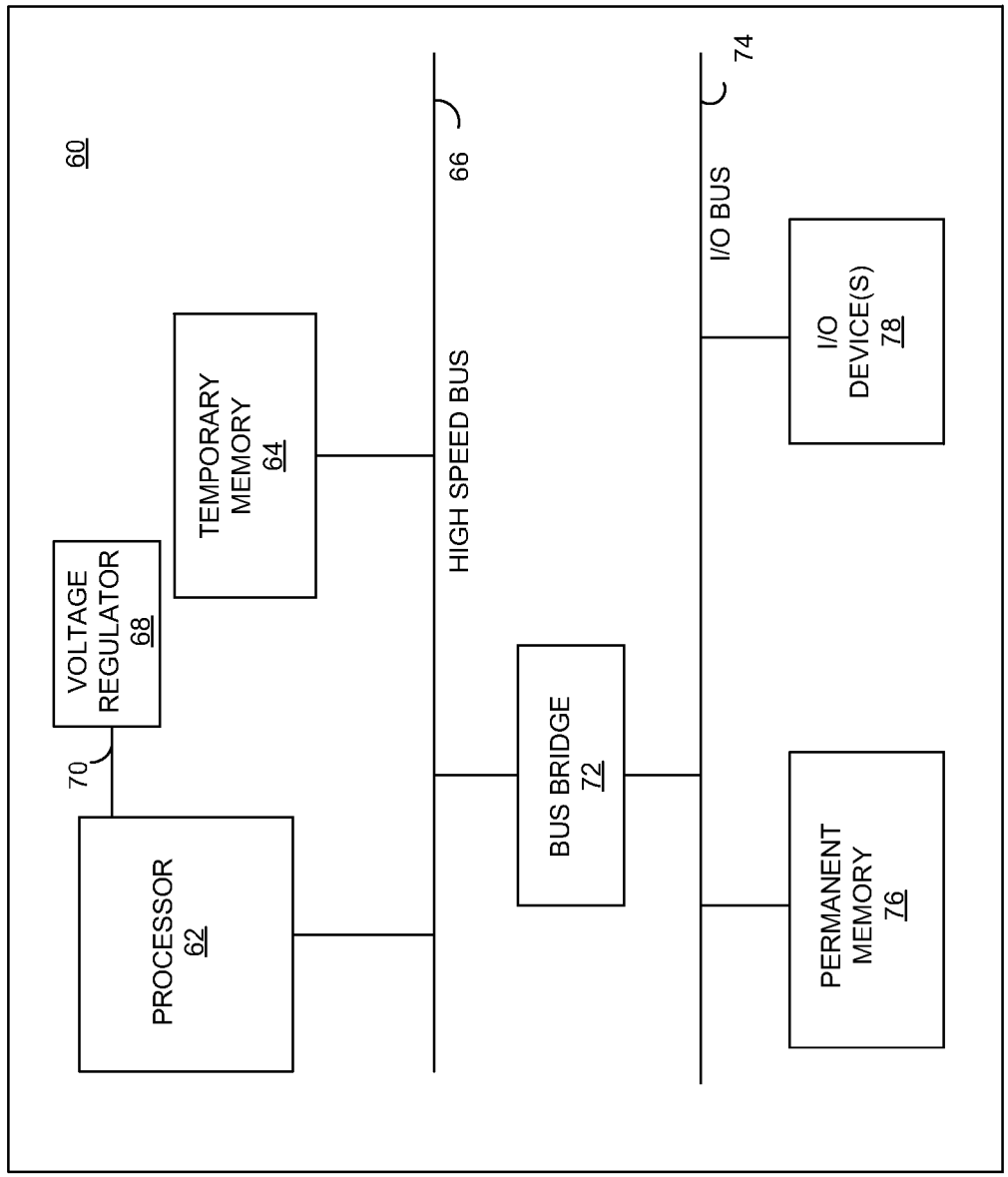
FIG. 9 is a system including an electronic assembly in accordance with an embodiment of the present invention.

FIG. 9 illustrates a block diagram of one of many possible electronic systems 60 in which embodiments of the present invention may be used. The electronic system 60 may utilize one or more embodiments of the electronic assembly 10 described herein. As shown, the system 60 includes a processor 62, such as an integrated circuit, and temporary memory 64, such as SDRAM and DRAM, on high-speed bus 66. Voltage regulator 68 may be utilized to provide power to processor 62 via traces 70. The high-speed bus 66 is connected through bus bridge 72 to input/output (I/O) bus 74. I/O bus 74 connects permanent memory 76, such as flash devices and mass storage device (e.g. fixed disk device), and I/O devices 78 to each other and bus bridge 72. In various embodiments, system 60 may be a set-top box, a digital camera, a CD player, a DVD player, a wireless mobile phone, a tablet computing device, or a laptop computing device.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method, comprising:
    attaching a mechanical divider to a mounting substrate, wherein the mechanical divider comprises a base surface contacting the mounting substrate;
    a lower wall surface extending upwardly from the base surface; an upper wall surface integral to the lower wall surface; and a ledge surface extending between and integral to the lower wall surface and the upper wall surface;
    dispensing a first layer of underfill material on the mounting substrate;
    placing at least a first portion of an active surface of an integrated circuit on the first layer of underfill material and a second portion of the active surface on the ledge surface of the mechanical divider;
    abutting a side wall of the integrated circuit to the upper wall surface of the mechanical divider; and
    shielding at least a portion of the active surface of the integrated circuit from out-gassing from the first layer of underfill material with the mechanical divider, wherein the ledge surface is formed prior to placing the second portion of the active surface of the integrated circuit on the ledge surface.

2. The method of claim 1, further comprising at least substantially curing the mechanical divider prior to the placing of the first portion of the active surface of the integrated circuit on the first layer of underfill material.

3. The method of claim 1, further comprising at least substantially curing the mechanical divider while the mechanical divider is attached to the mounting substrate.

4. The method of claim 1, further comprising at least substantially curing the mechanical divider prior to attaching the mechanical divider to the mounting substrate.

5. The method of claim 1, further comprising dispensing a second layer of underfill material on the mounting substrate, the second layer of underfill material contacting both a non-reactive surface of the integrated circuit and the mechanical divider.

6. The method of claim 1, wherein the dispensing comprises dispensing the first layer of underfill material on the mounting substrate within the lower wall surface of the mechanical divider.

7. The method of claim 1, wherein the upper wall surface extends perpendicularly from the ledge.

8. A method, comprising:
    attaching a mechanical divider to a mounting substrate, wherein the mechanical divider comprises a base surface contacting the mounting substrate;
    a lower wall surface extending upwardly from the base surface; an upper wall surface integral to the lower wall surface; and a ledge surface extending between and integral to the lower wall surface and the upper wall surface;
    dispensing a first layer of underfill material on the mounting substrate;
    placing a first portion of an active surface of an integrated circuit on both the mechanical divider and on the first layer of underfill material and a second portion of the active surface on the ledge surface of the mechanical divider, wherein the ledge surface is formed prior to placing the second portion of the active surface of the integrated circuit on the ledge surface; and
    abutting a side wall of the integrated circuit to the upper wall surface of the mechanical divider.

9. The method of claim 8, further comprising at least substantially curing the mechanical divider.

10. The method of claim 8, further comprises dispensing a second layer of underfill material on the mounting substrate, the second layer of underfill material contacting both a non-active surface of the integrated circuit and the mechanical divider.

11. The method of claim 8, further comprising at least substantially curing the mechanical divider while the mechanical divider is attached to the mounting substrate.

12. The method of claim 8, further comprising at least substantially curing the mechanical divider prior to attaching the mechanical divider to the mounting substrate.

13. The method of claim 8, further comprising fixing, by the mechanical divider, the distance between an active surface of the integrated circuit and the mounting substrate.

14. The method of claim 8, further comprising minimizing, by the mechanical divider, movement of the active surface of the integrated circuit with respect to the mounting substrate.

15. The method of claim 8, further comprising aligning, by the mechanical divider, the side wall of the integrated circuit with respect to the mounting substrate.

16. The method of claim 8, further comprising minimizing, by the mechanical divider, movement of the side wall of the integrated circuit with respect to the mounting substrate.

* * * * *